(12) United States Patent
Keil et al.

(10) Patent No.: US 9,111,724 B2
(45) Date of Patent: Aug. 18, 2015

(54) APPARATUS AND METHOD FOR CONTROLLING PLASMA POTENTIAL

(75) Inventors: Douglas Keil, Fremont, CA (US); Lumin Li, Santa Clara, CA (US); Reza Sadjadi, Saratoga, CA (US); Eric Hudson, Berkeley, CA (US); Eric Lenz, Pleasanton, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1070 days.

(21) Appl. No.: 12/905,041

(22) Filed: Oct. 14, 2010

(65) Prior Publication Data
US 2011/0024045 A1  Feb. 3, 2011

Related U.S. Application Data

(62) Division of application No. 11/456,545, filed on Jul. 10, 2006, now abandoned.

(51) Int. Cl.
*H01J 7/24* (2006.01)
*C23C 16/00* (2006.01)
*C23F 1/00* (2006.01)
*H01L 21/306* (2006.01)
*H01J 37/32* (2006.01)

(52) U.S. Cl.
CPC ..... *H01J 37/32183* (2013.01); *H01J 37/32091* (2013.01)

(58) Field of Classification Search
USPC ............. 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| | | | |
|---|---|---|---|
| 5,534,751 A | 7/1996 | Lenz et al. | 315/111.71 |
| 5,539,039 A * | 7/1996 | Kwak et al. | 524/401 |
| 6,391,787 B1 | 5/2002 | Dhindsa et al. | 438/710 |
| 6,879,870 B2 * | 4/2005 | Shannon et al. | 700/121 |
| 2001/0037770 A1 * | 11/2001 | Otsubo | 118/723.001 |
| 2002/0197402 A1 * | 12/2002 | Chiang et al. | 427/255.39 |
| 2004/0261714 A1 | 12/2004 | Choi | |
| 2005/0061445 A1 | 3/2005 | Koshiishi et al. | 156/345.47 |
| 2006/0000803 A1 | 1/2006 | Koshiishi et al. | 216/67 |

(Continued)

FOREIGN PATENT DOCUMENTS

| | | |
|---|---|---|
| EP | 1780777 | 5/2007 |
| JP | 2000-323456 | 11/2000 |
| WO | WO 2005/124844 | 12/2005 |

*Primary Examiner* — Maureen Gramaglia
(74) *Attorney, Agent, or Firm* — Martine Penilla Group, LLP (57) ABSTRACT

A chamber includes a lower electrode and an upper electrode. The lower electrode is defined to transmit a radiofrequency current through the chamber and to support a semiconductor wafer in exposure to a plasma within the chamber. The upper electrode is disposed above and in a spaced apart relationship with the lower electrode. The upper electrode is electrically isolated from the chamber and is defined by a central section and one or more annular sections disposed concentrically outside the central section. Adjacent sections of the upper electrode are electrically separated from each other by a dielectric material. Multiple voltage sources are respectively connected to the upper electrode sections. Each voltage source is defined to control an electric potential of the upper electrode section to which it is connected, relative to the chamber. The electric potential of each upper electrode section influences an electric potential of the plasma within the chamber.

18 Claims, 5 Drawing Sheets

(56) References Cited

U.S. PATENT DOCUMENTS

| | | |
|---|---|---|
| 2006/0066247 A1 | 3/2006 | Koshiishi et al. |
| 2006/0075969 A1 | 4/2006 | Fischer .......................... 118/725 |
| 2006/0219363 A1* | 10/2006 | Matsumoto et al. ...... 156/345.47 |
| 2006/0221540 A1* | 10/2006 | Himori et al. ................. 361/234 |

* cited by examiner

APPARATUS AND METHOD FOR CONTROLLING PLASMA POTENTIAL

CLAIM OF PRIORITY

This application is a divisional application of U.S. patent application Ser. No. 11/456,545, filed on Jul. 10, 2006, now abandoned the disclosure of which is incorporated in its entirety herein by reference.

BACKGROUND OF THE INVENTION

Semiconductor wafer ("wafer") fabrication often includes exposing a wafer to a plasma to allow the reactive constituents of the plasma to modify the surface of the wafer. The plasma processing of wafers is generally performed in a chamber in which a reactant gas is exposed to radiofrequency (RF) power to be transformed into the plasma. Currently, plasma confinement within the chamber is lost at high reactant gas flow rates. It is believed that this loss of the plasma confinement is due to Paschen breakdown in regions between the plasma and the chamber.

Electrons introduced into a neutral gas will gain energy if there is an electric field permeating the neutral gas. However, these same electrons will also lose energy via collisions with neutral gas molecules. If the energy gain of the electrons is, on average, large enough to ionize the neutral gas, plasma breakdown will occur. In the Paschen model, the effect of collisions between the electrons and the neutral gas molecules is characterized by the product (P*d), where (P) is the neutral gas pressure and (d) is a characteristic scale length of the device (the distance between the higher potential region and ground). The Paschen model qualitatively explains many observed reactant gas flow rate threshold trends for unconfinement of the plasma. Therefore, plasma confinement efforts have traditionally focused on minimizing the product (P*d). However, minimization of the product (P*d) often requires substantial re-design of existing plasma processing systems. Therefore, alternative methods are sought for improving plasma confinement while minimizing plasma processing system re-design.

SUMMARY OF THE INVENTION

In one embodiment, an apparatus for semiconductor wafer plasma processing is disclosed. The apparatus includes a chamber, a lower electrode, and an upper electrode. The lower electrode is disposed within the chamber and is defined to transmit a radiofrequency current through the chamber. The lower electrode is further defined to support a semiconductor wafer in exposure to a plasma to be generated within the chamber by the radiofrequency current. The upper electrode is disposed above and in a spaced apart relationship with the lower electrode. The upper electrode is electrically isolated from the chamber. The apparatus also includes a voltage source connected to the upper electrode. The voltage source is defined to control an electric potential of the upper electrode relative to the chamber. The electric potential of the upper electrode is capable of influencing an electric potential of the plasma to be generated between the lower electrode and the upper electrode. Thus, by enabling control of the electric potential of the upper electrode, the voltage source also enables control of the electric potential of the plasma.

In another embodiment, an apparatus for semiconductor wafer plasma processing is disclosed. The apparatus includes a chamber, a lower electrode, an upper electrode, and an impedance control device. The lower electrode is disposed within the chamber and is defined to transmit a radiofrequency current through the chamber. The lower electrode is further defined to support a semiconductor wafer in exposure to a plasma to be generated within the chamber by the radiofrequency current. The upper electrode is disposed above and in a spaced apart relationship with the lower electrode. The plasma is to be generated and confined to a volume between the lower electrode and the upper electrode. The impedance control device is connected between a central region of the upper electrode and a reference ground. The impedance control device is defined to control a radiofrequency current transmission path through the central region of the upper electrode. Control of the radiofrequency current transmission path by the impedance control device enables confinement control of the plasma.

In another embodiment, an apparatus for semiconductor wafer plasma processing is disclosed. The apparatus includes a lower electrode disposed within a chamber. The lower electrode is defined to transmit a radiofrequency current through the chamber. The lower electrode is further defined to support a semiconductor wafer in exposure to a plasma to be generated within the chamber by the radiofrequency current. An upper electrode is disposed above and in a spaced apart relationship with the lower electrode. The upper electrode is defined by a doped semiconductor material. A doping concentration within the upper electrode varies radially from a center to a periphery of the upper electrode.

In another embodiment, a method is disclosed for controlling plasma confinement. The method includes an operation for generating a plasma within a chamber between a lower electrode and an upper electrode. The method also includes an operation for controlling a voltage source connected between the upper electrode and the chamber. Controlling the voltage source in turn controls an electric potential on the upper electrode. An electric potential of the plasma responds to control of the electric potential on the upper electrode. The electric potential of the plasma affects a confinement of the plasma within the chamber.

In another embodiment, an apparatus for semiconductor wafer plasma processing is disclosed. The apparatus includes a chamber, a lower electrode, and an upper electrode. The lower electrode is disposed within the chamber and is defined to transmit a radiofrequency current through the chamber. The lower electrode is defined to support a semiconductor wafer in exposure to a plasma to be generated within the chamber by the radiofrequency current. The upper electrode is disposed above and in a spaced apart relationship with the lower electrode. The upper electrode is electrically isolated from the chamber. The upper electrode is defined by a central section and one or more annular sections disposed concentrically outside the central section. Adjacent sections of the upper electrode are electrically separated from each other by a dielectric material. The apparatus further includes multiple voltage sources respectively connected to the central section and the one or more annular sections of the upper electrode. Each voltage source is defined to control an electric potential of the upper electrode section to which it is connected, relative to the chamber. The electric potential of each upper electrode section influences an electric potential of the plasma to be generated between the lower electrode and the upper electrode.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
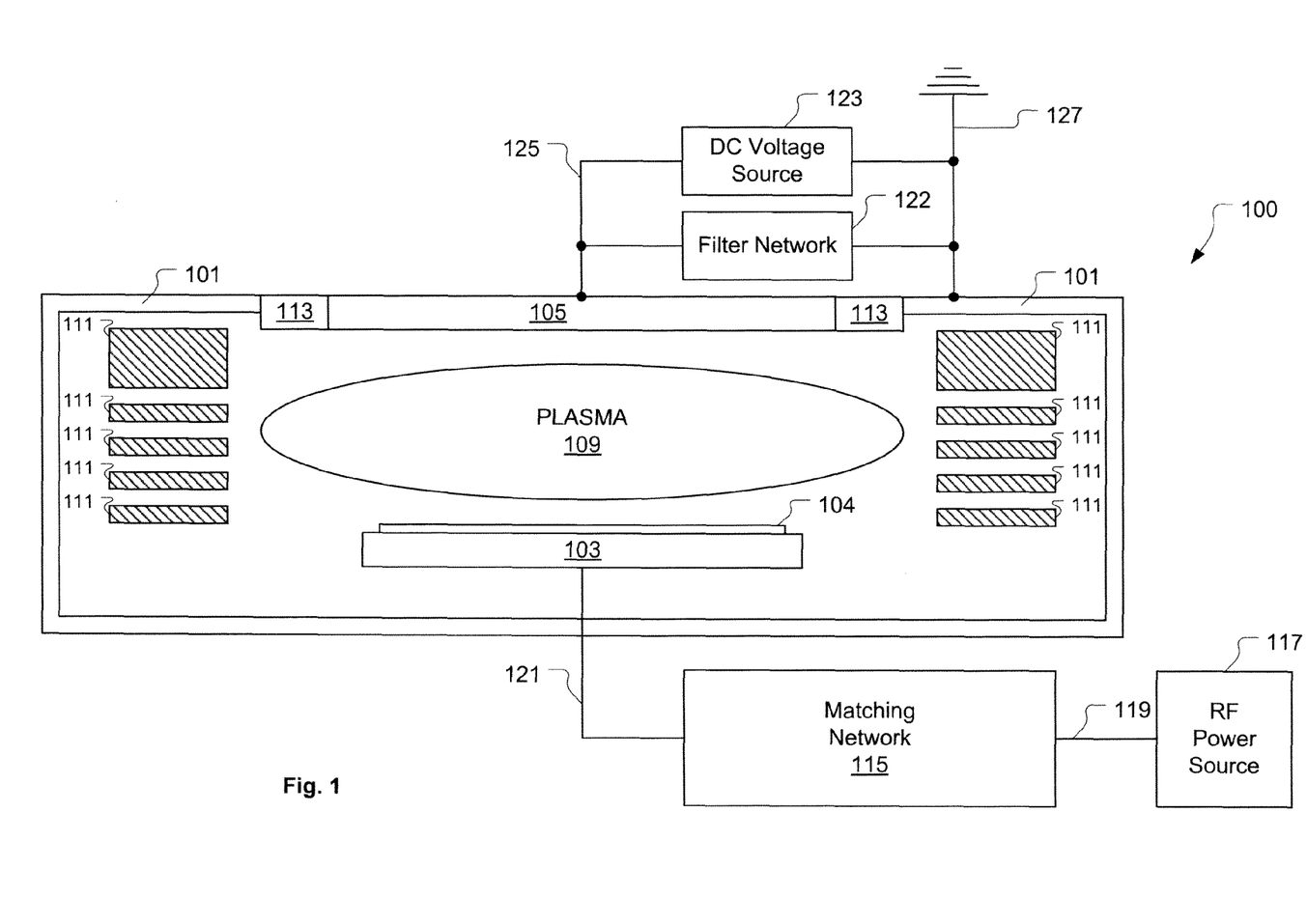
FIG. 1 is an illustration showing a plasma processing system for semiconductor wafer processing, in accordance with one embodiment of the present invention.

FIG. 1 is an illustration showing a plasma processing system 100 for semiconductor wafer processing, in accordance with one embodiment of the present invention. The system 100 includes a plasma processing chamber ("chamber") 101 within which a plasma 109 can be generated in exposure to a substrate 104. It should be understood that the substrate 104 can represent a semiconductor wafer or any other type of substrate within which electronic elements are to be defined. The chamber 101 includes a lower electrode 103 and an upper electrode 105. During operation, radiofrequency (RF) power is generated by an RF power source 117 and transmitted through a matching network 115 to the lower electrode 103, via connections 119 and 121. It should be appreciated that the matching network 115 is defined to provide appropriate impedance matching to ensure that the RF power is properly transmitted from the source 117 to a load. The RF power received at the lower electrode 103 is transmitted through the chamber 101 volume to the upper electrode 105, which is maintained at a controlled electric potential relative to a reference ground. In one embodiment, the chamber 101 serves as the reference ground.

The upper electrode 105 is connected to a direct current (DC) voltage source 123 through connection 125. The DC voltage source 123 is in turn connected to the reference ground through connection 127. A filter network 122 is connected between the upper electrode 105 and the reference ground to provide a means by which RF current can be routed around the DC voltage source 123 directly to ground. It should be appreciated that the upper electrode 105 is electrically isolated from the chamber 101. In one embodiment, the upper electrode 105 is electrically isolated from the chamber 101 by a dielectric material 113. In the embodiment where the upper electrode is disc-shaped, the dielectric material 113 may be ring-shaped. Because the upper electrode 105 is electrically isolated, the electric potential of the upper electrode 105 relative to ground, i.e., relative to the chamber 101, can be controlled by the DC voltage source 123. Furthermore, because the electric potential of the plasma 109 is influenced by the electric potential of the upper electrode 105, control of the electric potential of the upper electrode 105 via the DC voltage source 123 enables control of the electric potential of the plasma 109.

During operation, a reactant gas is supplied to the chamber 101 volume in a controlled manner. The RF power transmitted from the lower electrode 103 through the chamber 101 volume, i.e., through the reactant gas, to the upper electrode 105 serves to transform the reactant gas into the plasma 109. A density of the plasma 109 at a particular location within chamber 101 is proportional to an amount of RF power being transmitted through the particular location within the chamber 101. Therefore, increased RF power transmission through a particular location within the chamber 101 will result in an increased plasma 109 density at the particular location within the chamber 101, vice-versa.

A set of confinement rings 111 are positioned within the chamber 101 to surround a volume overlying the substrate 104 between the lower and upper electrodes 103/105. It should be appreciated that FIG. 1 shows an exemplary number of confinement rings 111. In other embodiments, there may be more or less confinement rings 111 than what is shown in FIG. 1. The confinement rings 111 serve to confine the plasma 109 to the volume overlying the substrate 104. More specifically, the plasma 109 extinguishes in the slots between the confinement rings 111. An electric potential between the inner and outer periphery of the slot between confinement rings 111 influences the ability of the slot to confine the plasma 109. Therefore, control of the electric potential of the plasma 109 relative to the region outside the confinement rings 111 enables control of the plasma 109 confinement. In general, a lower electric potential of the plasma 109 with respect to the chamber 101 enables easier confinement of the plasma 109.

It should be appreciated that the plasma processing chamber 101 and system 100 includes many other features and components that are not described herein to avoid unnecessarily obscuring the present invention. The present invention is primarily concerned with controlling electric potential of the plasma 109 within the chamber 101 by controlling an electric potential of the upper electrode 105 and/or RF power transmission paths through the chamber 101.

In the embodiment of FIG. 1, the DC voltage source 123 is connected near a center of the upper electrode 105. The electric potential of the upper electrode 105, as controlled by the DC voltage source 123, is capable of reducing the electric potential of the plasma 109 relative to the chamber 101. Thus, the DC voltage source 123 is capable of "biasing" the electric potential of the plasma 109 with respect to the chamber 101. The polarity of the DC voltage source 123 is set to bias the electric potential of the plasma 109 such that an electric field present between the confinement rings 111 and the chamber 101 is reduced. The reduction in electric field strength between the confinement rings 111 and the chamber 101 serves to increase a plasma confinement capability. The voltage level of the DC voltage source 123 can be set to optimize plasma confinement. The particular voltage level required to optimize the plasma confinement, i.e., the optimum voltage level, can vary depending on chamber specific configuration details. However, the optimum voltage level should be less than the electric potential of the plasma 109 with respect to the chamber 101.

In one embodiment, the DC voltage source 123 is defined as an "ideal" voltage source that appears as a short circuit with respect to RF current. In another embodiment, the DC voltage source 123 is not "ideal", but is defined to represent low impedance to RF current. In yet another embodiment, the DC voltage source 123 is defined to represent a constant impedance to RF current.

A known difficulty with confined plasma processing systems is the loss of plasma confinement at high reactant gas flow rates. Control of the electric potential of the plasma 109, as provided by the DC voltage source 123, enables reduction of the electric field between the confinement rings 111 and the chamber 101, thereby expanding the plasma confinement window. The expanded plasma confinement window allows the plasma to be confined at higher reactant gas flow rates. Therefore, the expanded plasma confinement window afforded by the DC voltage source 123 allows increased flexibility in establishing the plasma process parameters, such as gas flow rate.

It should be appreciated that enhanced control of the plasma electric potential provides for enhanced process control, even beyond the allowable increase in gas flow rate. For example, enhanced control of the plasma electric potential can enable adjustment of the ion energy distribution incident upon the surface of the wafer 104. Adjustment of the ion energy distribution incident upon the surface of the wafer 104 affects an etch profile obtained across the surface of the wafer 104. More specifically, the electric potential between the plasma 109 and the surface of the lower electrode 103 determines the energy that will be acquired by ions as they travel through the region, i.e., sheath, between the plasma 109 and the wafer 104. Through manipulation of the plasma electric potential, as afforded by the DC voltage source 123, it is possible to manipulate the electric potential difference across the sheath. Manipulation of the electric potential difference across the sheath has a direct effect on the ion energy distribution contacting the wafer 104.

Figure 2:
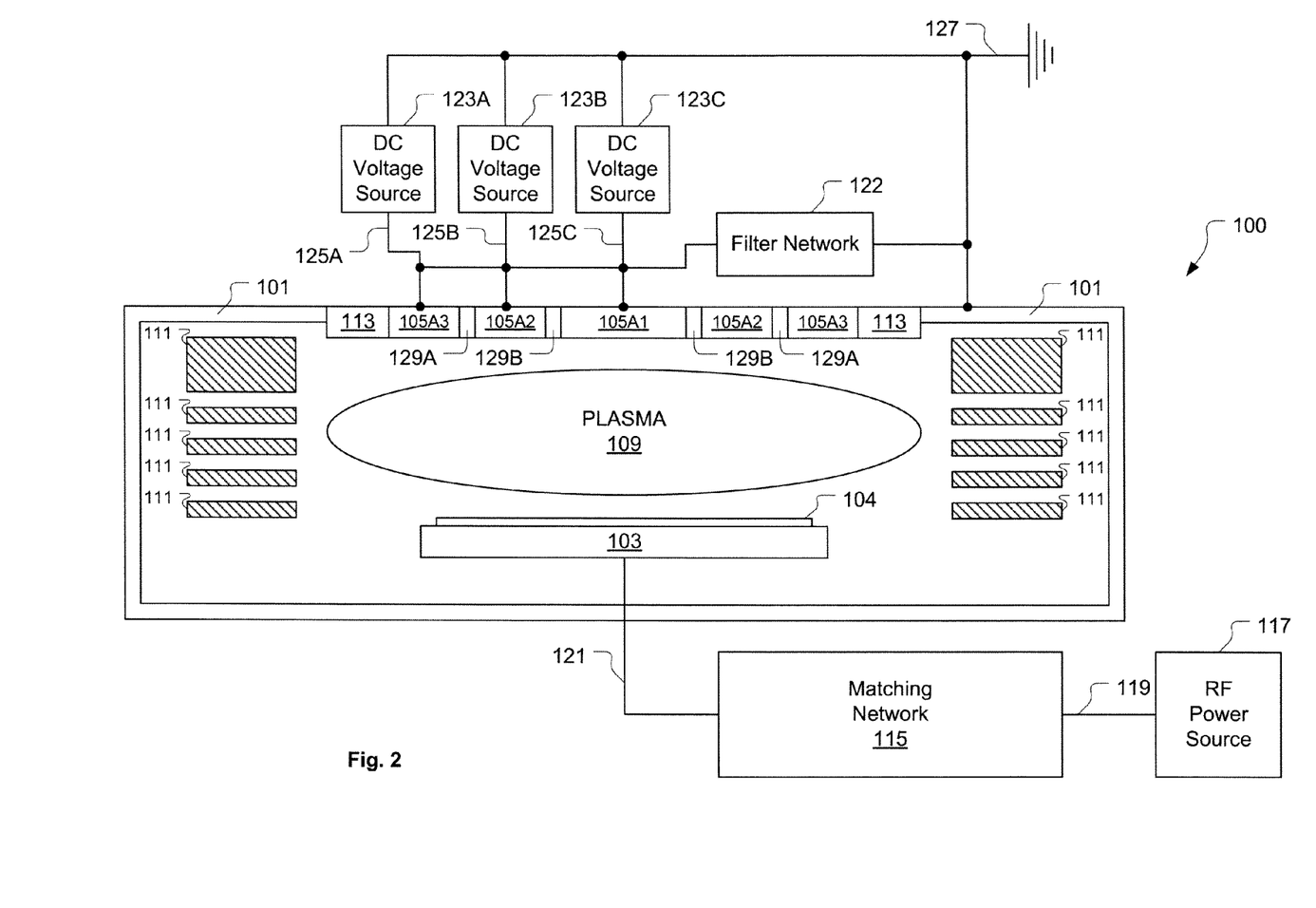
FIG. 2 is an illustration showing a plasma processing system for semiconductor wafer processing, in accordance with another embodiment of the present invention.

In some situations it may be desirable to have more spatial control of the plasma electric potential. Increased spatial control of the plasma electric potential can be realized by enabling increased spatial control of the electric potential across the upper electrode 105. FIG. 2 is an illustration showing a plasma processing system for semiconductor wafer processing, in accordance with another embodiment of the present invention. The plasma processing system of FIG. 2 is essentially the same as that previously described with respect to FIG. 1, with the exception of the upper electrode 105 and DC voltage source 123. In the embodiment of FIG. 2, the upper electrode is defined by a central section 105A1, an annular section 105A2, and an annular section 105A3, wherein the annular sections are disposed concentrically outside the central section. Adjacent sections of the upper electrode are electrically separated from each other by dielectric material regions 129A and 129B. It should be appreciated that the particular sectioning of the upper electrode as illustrated in the embodiment of FIG. 2 is exemplary and is not intended to be limiting. In other embodiments, the number and size of upper electrode sections and corresponding DC voltage sources may be established in essentially any manner as necessary to fulfill plasma processing requirements.

Each section of the upper electrode (105A1, 105A2, and 105A3) is connected to a respective DC voltage source (123A, 123B, and 123C). The DC voltage sources 123A, 123B, and 123C are defined in the same manner as the DC voltage source 123, previously described with respect to the embodiment of FIG. 1. The filter network 122 is connected between the each section of the upper electrode (105A1, 105A2, 105A3) and the reference ground to provide a means by which RF current can be routed around the DC voltage sources (123A, 123B, 123C) directly to ground. The DC voltage sources 123A-123C can be used to maintain their respective section of the upper electrode at a different electric potential with respect to the chamber 101. Thus, the sectioned upper electrode enables establishment of an electric potential distribution above the plasma 109. By influencing the electric potential distribution within the plasma 109, the electric potential distribution of the sectioned upper electrode has an associated effect on the etch characteristics across the wafer 104.

Figure 3:
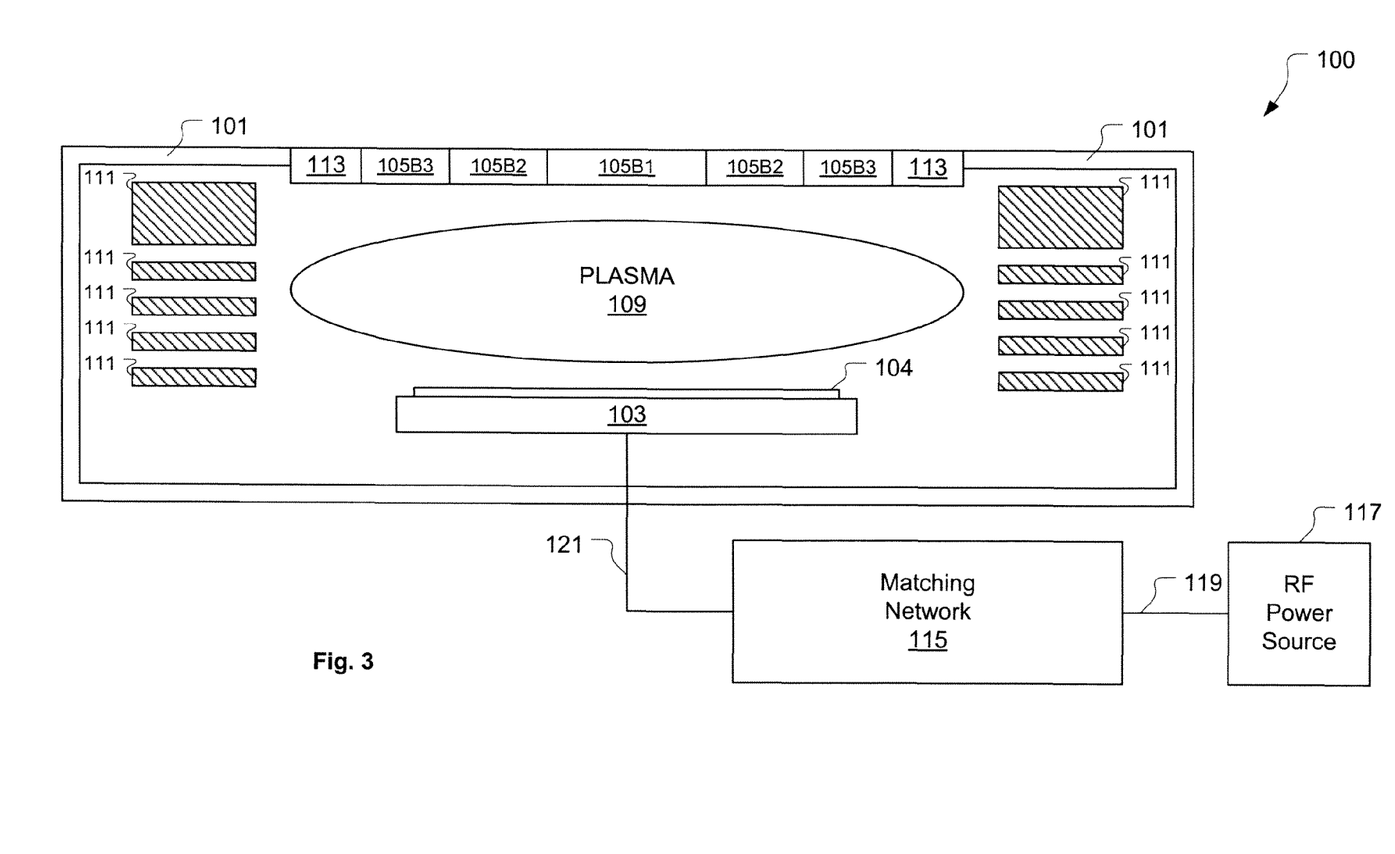
FIG. 3 is an illustration showing a plasma processing system for semiconductor wafer processing, in accordance with another embodiment of the present invention.

FIG. 3 is an illustration showing a plasma processing system for semiconductor wafer processing, in accordance with another embodiment of the present invention. The plasma processing system of FIG. 3 is essentially the same as that previously described with respect to FIG. 1, with the exception of the upper electrode 105 and DC voltage source 123. In the embodiment of FIG. 3, the upper electrode is defined by a doped semiconductor material, e.g., doped silicon, wherein a doping concentration within the upper electrode varies radially from the center to the periphery of the upper electrode. For example, in one embodiment, the upper electrode includes a first doping concentration in a central section 105B1, a second doping concentration in an annular section 105B2, and a third doping concentration in an annular section 105B3, wherein the annular sections are disposed concentrically outside the central section. It should be appreciated that the particular sectioning of the upper electrode, as illustrated in the embodiment of FIG. 3, is exemplary and is not intended to be limiting. In other embodiments, the upper electrode may be sectioned to have essentially any doping profile as necessary to fulfill plasma processing requirements.

The doping concentration at a given location within the upper electrode in the embodiment of FIG. 3 is defined to control an electrical resistance through the given location of the upper electrode. The electrical resistance through the given location of the upper electrode is capable of influencing an electric potential of the upper electrode at the given location. Thus, the upper electrode having the doping profile enables establishment of an electric potential distribution above the plasma 109. As previously stated, by influencing the electric potential distribution within the plasma 109, the electric potential distribution of the upper electrode has an associated effect on the etch characteristics across the wafer 104. In one embodiment the upper electrode (105B1-105B3) is electrically isolated from the chamber 101. In this embodiment, one or more voltage sources can be connected to the upper electrode to control an electric potential distribution across the upper electrode.

Figure 4:
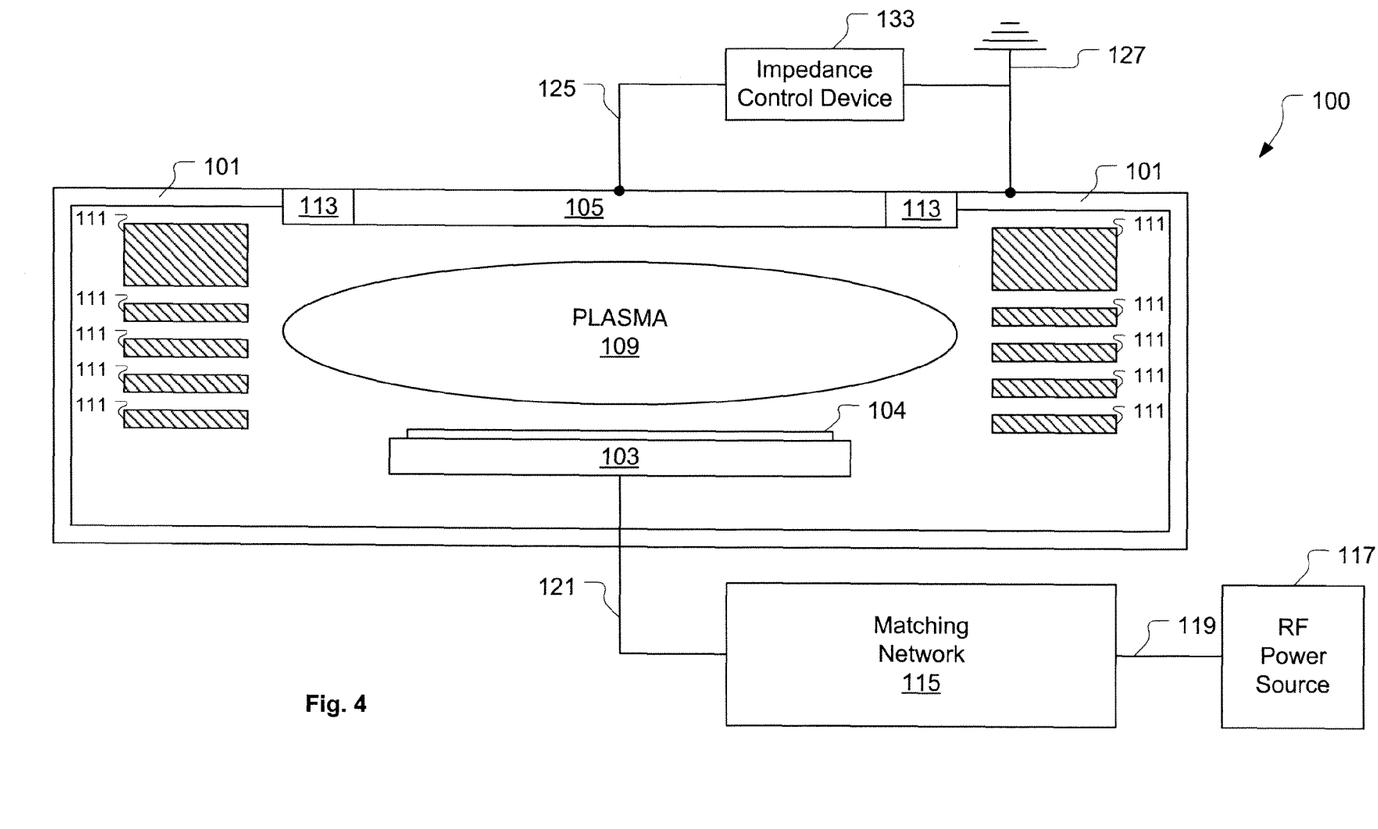
FIG. 4 is an illustration showing a plasma processing system for semiconductor wafer processing including an impedance control device, in accordance with one embodiment of the present invention.

FIG. 4 is an illustration showing a plasma processing system for semiconductor wafer processing including an impedance control device 133, in accordance with one embodiment of the present invention. The plasma processing system of FIG. 4 is essentially the same as that previously described with respect to FIG. 1, with the exception of the DC voltage source 123. The embodiment of FIG. 4 does not require the DC voltage source 123, however, some embodiments may implement the DC voltage source 123. The plasma processing system of FIG. 4 includes the impedance control device 133 connected between a central region of the upper electrode and a reference ground, e.g., the chamber 101. The impedance control device 133 is defined to control the RF current transmission path through the central region of the upper electrode 105. Control of the RF current transmission path enables confinement control of the plasma.

For example, in one embodiment, the lower electrode is controlled to transmit RF power at both 2 MHz and 27 MHz. In this embodiment, the impedance control device 133 is defined as a filter network, i.e., an inductor and capacitor in parallel, which provides high impedance to the 2 MHz RF current passing through the central region of the upper electrode 105. Therefore, the impedance control device 133 causes the 2 MHz RF current to favor a transmission path near the periphery of the upper electrode 105, thus causing an increase power deposition near the periphery of the upper electrode 105. The increased power deposition near the periphery of the upper electrode 105 serves to enhance, i.e., strengthen, confinement of the plasma 109.

Figure 5:
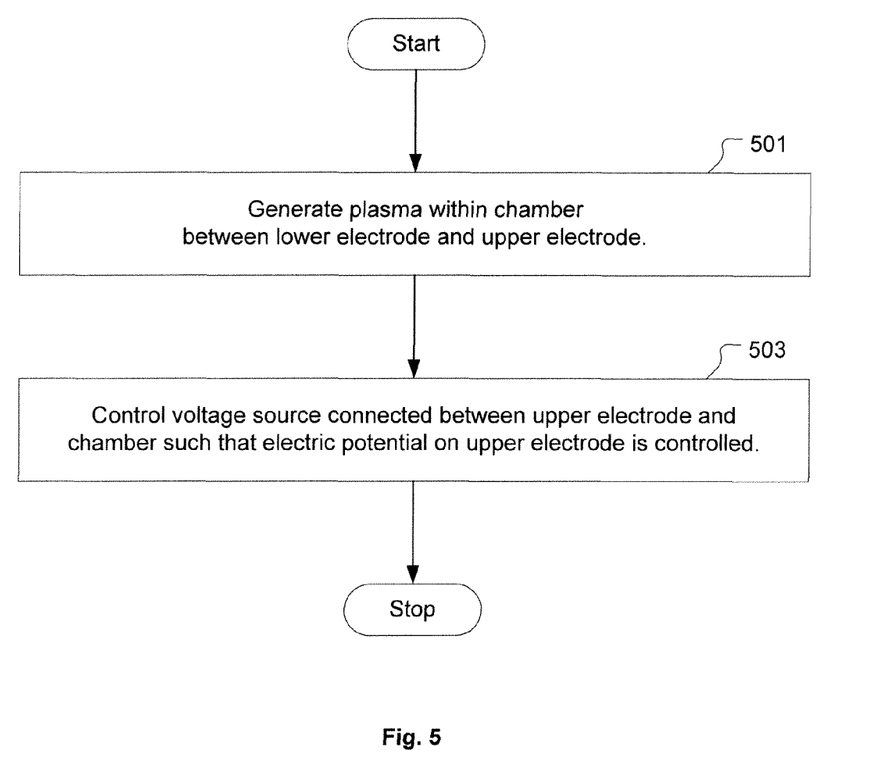
FIG. 5 is an illustration showing a flowchart of a method for controlling plasma confinement, in accordance with one embodiment of the present invention.

FIG. 5 is an illustration showing a flowchart of a method for controlling plasma confinement, in accordance with one embodiment of the present invention. The method of FIG. 5 can be implemented using the plasma processing system previously described with respect to FIGS. 1 and 2. The method includes an operation 501 for generating a plasma within a chamber between a lower electrode and an upper electrode. The method also includes an operation 503 for controlling a voltage source connected between the upper electrode and the chamber such that an electric potential on the upper electrode is controlled. In one embodiment, the voltage source is a DC voltage source having low impedance to RF current. An electric potential of the generated plasma responds to control of the upper electrode electric potential. The electric potential of the plasma affects confinement of the plasma within the chamber.

In one embodiment, the voltage source is controlled to cause the electric potential of the plasma to be decreased relative to the chamber. The decreased electric potential of the plasma serves to support confinement of the plasma. The method can further include an operation for establishing a polarity of the voltage source such that the electric field strength between the plasma and the chamber is reduced. This reduction in electric field strength serves to support confinement of the plasma. In another embodiment, operation 503 can include independently controlling multiple voltage sources, wherein each of the multiple voltage sources is defined to control an electric potential of a respective section of the upper electrode. Independent control of the electric potential of the various sections of the upper electrode enables establishment of an electric potential profile across the entirety of the upper electrode. The established electric potential profile across the upper electrode can be used to correspondingly control the electric potential of the plasma.

The plasma processing chamber 101 in the above-described embodiments provides the confinement rings 111 as a confinement mechanism. However, it should be understood that the plasma processing chamber 101 can include other confinement mechanisms in addition to the confinement rings 111. Regardless of the particular confinement mechanisms implemented within the plasma processing chamber 101, it should be appreciated that plasma confinement is improved when the potential drop from the plasma, through the confinement rings 111, to the chamber walls is such that the resulting electric field is sufficient to enhance ion confinement. Therefore, regardless of the particular confinement mechanisms implemented within the plasma processing chamber 101, it should be recognized that DC voltage source 123 provided herein serves to improve plasma confinement by influencing the potential drop from the plasma to the chamber walls.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for semiconductor wafer plasma processing, comprising:
   a chamber having a top plate, a bottom plate, and a sidewall extending vertically between the top plate and the bottom plate;
   a lower electrode disposed within the chamber and defined to transmit a radiofrequency current through the chamber, the lower electrode defined to support a semiconductor wafer in exposure to a plasma to be generated within the chamber by the radiofrequency current;
   an upper electrode disposed above and in a spaced apart relationship with the lower electrode, wherein the upper electrode is electrically isolated from the chamber, wherein the upper electrode is defined by a central section and one or more annular sections disposed concentrically outside the central section;
   one or more inner dielectric material members respectively disposed between adjacent sections of the upper electrode so as to electrically separate the adjacent sections of the upper electrode and so as to rigidly maintain a physical spacing between the adjacent sections of the upper electrode;
   an outer dielectric material member disposed between an outermost section of the upper electrode and the top plate of the chamber so as to electrically separate the outermost section of the upper electrode from the top plate of the chamber and so as to rigidly maintain a physical spacing between the outermost section of the upper electrode and the top plate of the chamber, the outer dielectric material physically contacting both the outermost section of the upper electrode and the top plate of the chamber; and
   multiple voltage sources respectively connected to the central section and the one or more annular sections of the upper electrode, wherein each voltage source is defined to control an electric potential of the upper electrode section to which it is connected relative to the chamber, wherein the electric potential of each upper electrode section influences an electric potential of the plasma to be generated between the lower electrode and the upper electrode, wherein each of the multiple voltage sources is a direct current voltage source;
   wherein a combination of the central section of the upper electrode, and the one or more annular sections of the upper electrode, and the one or more inner dielectric material members, and the outer dielectric material member together form a disc shaped structure having a substantially equal and uniform vertical height as measured in the direction extending perpendicular to both the upper and lower electrodes;
   a radiofrequency power source connected to provide radiofrequency power to the lower electrode; and
   a matching network connected between the radiofrequency power source and the lower electrode, such that radiofrequency power is transmitted through the matching network to the lower electrode, wherein only the lower electrode is connected to receive radiofrequency power from the radiofrequency power source;
   wherein each of the central section of the upper electrode and the one or more annular sections of the upper electrode is formed as a respective non-perforated solid member.

2. An apparatus for semiconductor wafer plasma processing as recited in claim 1, wherein each of the multiple voltage sources is independently controllable.

3. An apparatus for semiconductor wafer plasma processing as recited in claim 1, wherein each of the multiple voltage sources is defined to control an electric potential of the upper electrode section to which the voltage source is connected to enable establishment of an electric potential profile across an entirety of the upper electrode.

4. An apparatus for semiconductor wafer plasma processing as recited in claim 1, wherein the outer dielectric material is defined to have the substantially equal and uniform vertical height as measured in the direction extending perpendicular to both the upper and lower electrodes.

5. An apparatus for semiconductor wafer plasma processing as recited in claim 1, wherein the electric potential of the upper electrode as controlled by the multiple voltage sources is capable of reducing an electric potential of the plasma relative to the chamber, the reduction in the electric potential of the plasma enabling plasma confinement.

6. An apparatus for semiconductor wafer plasma processing as recited in claim 1, wherein the multiple voltage sources are defined to maintain the electric potential of the upper electrode at a level less than the electric potential of the plasma.

7. An apparatus for semiconductor wafer plasma processing as recited in claim 1, wherein each of the multiple voltage sources is defined to represent low impedance to the radiofrequency current to be transmitted through the chamber.

8. An apparatus for semiconductor wafer plasma processing as recited in claim 1, further comprising:
a set of confinement rings positioned within the chamber to surround a volume overlying the lower electrode between the lower electrode and the upper electrode.

9. An apparatus for semiconductor wafer plasma processing as recited in claim 8, wherein the set of confinement rings is defined such that slots exist between the confinement rings, wherein the slots extend from the volume overlying the lower electrode to an outer volume between the set of confinement rings and the chamber.

10. An apparatus for semiconductor wafer plasma processing as recited in claim 9, wherein the multiple voltage sources are defined to maintain the electric potential of the upper electrode to ensure extinguishing of the plasma within the slots between the confinement rings.

11. An apparatus for semiconductor wafer plasma processing as recited in claim 1, further comprising:
a filter network connected between a reference ground potential and each of the central section and the one or more annular sections of the upper electrode.

12. An apparatus for semiconductor wafer plasma processing as recited in claim 11, wherein the filter network is defined to enable routing of radiofrequency current from the upper electrode around the multiple voltage sources.

13. An apparatus for semiconductor wafer plasma processing as recited in claim 1, wherein the matching network is defined to provide impedance matching to ensure that the radiofrequency power is transmitted from the radiofrequency power source to the plasma to be generated within the chamber.

14. An apparatus for semiconductor wafer plasma processing as recited in claim 1, wherein the radiofrequency power source is defined to supply radiofrequency power at frequencies of both 2 megahertz and 27 megahertz.

15. An apparatus for semiconductor wafer plasma processing, comprising:
a chamber having a top plate, a bottom plate, and a sidewall extending vertically between the top plate and the bottom plate;
a lower electrode disposed within the chamber and defined to transmit a radiofrequency current through the chamber, the lower electrode having a top surface defined to support a semiconductor wafer in exposure to a plasma to be generated within the chamber by the radiofrequency current;
an upper electrode disposed above and spaced apart from the lower electrode, the upper electrode having a top surface and a bottom surface, each of the top surface and the bottom surface of the upper electrode being substantially planar and oriented substantially parallel to the top surface of the lower electrode, the upper electrode including multiple electrically conductive sections, each of the multiple electrically conductive sections formed as a corresponding non-perforated solid member between the top and bottom surfaces of the upper electrode, the multiple electrically conductive sections including a central section and one or more annular sections disposed concentrically outside the central section, adjacent ones of the multiple electrically conductive sections of the upper electrode separated from each other by a solid dielectric material disposed between the top and bottom surfaces of the upper electrode; and
an outer dielectric ring disposed between an outermost one of the multiple electrically conductive sections of the upper electrode and the top plate of the chamber, the outer dielectric ring having a top surface aligned with the top surface of the upper electrode, the outer dielectric ring having a bottom surface aligned with the bottom surface of the upper electrode, the outer dielectric ring having a uniform thickness at each location between the outermost one of the multiple electrically conductive sections of the upper electrode and the top plate of the chamber, the uniform thickness of the outer dielectric ring measured in a direction perpendicular to both the top and bottom surfaces of the upper electrode;
multiple voltage sources respectively connected to the multiple electrically conductive sections of the upper electrode, such that one of the multiple voltage sources is connected to a corresponding one of the multiple electrically conductive sections of the upper electrode;
a radiofrequency power source connected to provide radiofrequency power to the lower electrode; and
a matching network connected between the radiofrequency power source and the lower electrode, such that a radiofrequency power transmission path exists through the matching network to the lower electrode, wherein only the lower electrode is connected to receive radiofrequency power from the radiofrequency power source;
wherein each of the multiple voltage sources is a direct current voltage source.

16. An apparatus for semiconductor wafer plasma processing as recited in claim 15,
wherein each of the multiple voltage sources is independently controllable.

17. An apparatus for semiconductor wafer plasma processing as recited in claim 16, further comprising:
a filter network connected between a reference ground potential and each of the multiple electrically conductive sections of the upper electrode.

18. An apparatus for semiconductor wafer plasma processing as recited in claim 17, wherein the filter network is electrically connected directly to each of the multiple electrically conductive sections of the upper electrode.

* * * * *